US009599889B2

United States Patent
Yamaguchi et al.

(10) Patent No.: US 9,599,889 B2
(45) Date of Patent: Mar. 21, 2017

(54) METHOD FOR MANUFACTURING SUPPORT FRAME FOR PELLICLE, SUPPORT FRAME FOR PELLICLE, AND PELLICLE

(71) Applicant: NIPPON LIGHT METAL COMPANY, LTD., Tokyo (JP)

(72) Inventors: Takayuki Yamaguchi, Shizuoka (JP); Yoshihiro Taguchi, Shizuoka (JP); Akira Iizuka, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 72 days.

(21) Appl. No.: 14/415,416

(22) PCT Filed: Jul. 11, 2013

(86) PCT No.: PCT/JP2013/068979
§ 371 (c)(1),
(2) Date: Jan. 16, 2015

(87) PCT Pub. No.: WO2014/013931
PCT Pub. Date: Jan. 23, 2014

(65) Prior Publication Data
US 2015/0205195 A1    Jul. 23, 2015

(30) Foreign Application Priority Data

Jul. 17, 2012  (JP) ................. 2012-158731
Jul. 17, 2012  (JP) ................. 2012-158732
Jul. 17, 2012  (JP) ................. 2012-158733

(51) Int. Cl.
*G03F 1/64* (2012.01)
*C25D 11/16* (2006.01)

(52) U.S. Cl.
CPC ............. *G03F 1/64* (2013.01); *C25D 11/16* (2013.01)

(58) Field of Classification Search
CPC .................................. G03F 1/64; C25D 11/16
USPC ..................................... 430/5; 205/213, 214
See application file for complete search history.

(56) References Cited

U.S. PATENT DOCUMENTS

2011/0081604 A1   4/2011   Tsukada et al.

FOREIGN PATENT DOCUMENTS

| JP | 6-128677 A | 5/1994 |
| JP | 9-236908 A | 9/1997 |
| JP | 2001-279359 A | 10/2001 |
| JP | 3361429 B2 | 1/2003 |
| JP | 2010-146027 A | 7/2010 |
| JP | 2010-237282 A | 10/2010 |
| JP | 2011-76037 A | 4/2011 |
| JP | 2012-93517 A | 5/2012 |
| JP | 2012-93518 A | 5/2012 |

OTHER PUBLICATIONS

International Search Report, issued in PCT/JP2013/068979, dated Aug. 13, 2013.
English translations of the International Preliminary Report on Patentability and Written Opinion of the International Searching Authority (Forms PCT/IB/338, PCT/IB/373 and PCT/ISA/237), dated Jan. 29, 2015, for International Application No. PCT/JP2013/068979.
Extended European Search Report, dated Sep. 28, 2016, for European Application No. 13820171.0.

*Primary Examiner* — Christopher Young
(74) *Attorney, Agent, or Firm* — Birch, Stewart, Kolasch & Birch, LLP

(57) ABSTRACT

Provided are a method of manufacturing a support frame for a pellicle, capable of forming a sufficiently blackened anodic oxide film through anodic oxidation treatment and providing a support frame for a pellicle industrially inexpensively with ease, a support frame for a pellicle obtained by the method, and a pellicle. Specifically, provided are a method of manufacturing a support frame for a pellicle to be used as a pellicle including an optical thin film, the method including: annealing an aluminum material formed of an Al—Zn—Mg based aluminum alloy; and subjecting the aluminum material to anodic oxidation treatment in an alkaline solution to form an anodic oxide film having a lightness index L* value of 40 or less, a support frame for a pellicle obtained by the method, and a pellicle including the support frame for a pellicle and an optical thin film.

11 Claims, No Drawings

METHOD FOR MANUFACTURING SUPPORT FRAME FOR PELLICLE, SUPPORT FRAME FOR PELLICLE, AND PELLICLE

TECHNICAL FIELD

The present invention relates to a method of manufacturing a support frame for a pellicle, a support frame for a pellicle, and a pellicle. More particularly, the present invention relates to a method of manufacturing a support frame for a pellicle, enabling sufficient blackening through anodic oxidation treatment without secondary electrolysis or coloring treatment such as one using an organic dye, a support frame for a pellicle obtained by the method, and a pellicle.

BACKGROUND ART

Manufacturing of a thin film, transistor (TFT), a color filter (CF), and the like to be used in, for example, a semiconductor device such as an LSI and a VLSI or a liquid crystal display device (LCD) includes a photolithography step using an exposing device. In this step, dust preventing means called a pellicle is generally used.

The pellicle is generally obtained by bonding on one surface of a support frame formed of an aluminum material having a shape corresponding to that of a photomask or a reticle and having a thickness of about several millimeters a transparent polymer film (optical thin film) having a thickness of about 10 μm made of nitrocellulose, a cellulose derivative; a fluorine polymer, or the like, while expanding the film. The pellicle prevents foreign materials from directly adhering onto the photomask or the reticle. In addition, even when foreign materials adhere onto the pellicle, such foreign materials do not form images on, for example, a wafer onto which a photoresist has been applied. Therefore, it is possible to prevent short circuit, disconnection, and the like of an exposure pattern due to images from the foreign materials, and improve a manufacturing yield in the photolithography step.

In manufacturing of the support frame for a pellicle, an aluminum material is generally blackened after anodic oxidation treatment for the purposes of, for example, preventing reflection of light from a light source to provide a clear transferred image of a pattern and facilitating a foreign material adhesion test before use. For example, there have been known a blackening method involving impregnating pores of an anodic oxide film with an organic dye or the like (for example, see Patent Literature 1) and a blackening method involving electrolytic deposition of Ni, Co, or the like into pores of an anodic oxide film (for example, see Patent Literature 2).

Meanwhile, in recent years, along with high integration of a semiconductor device or the like, a circuit pattern has been required to be drawn more finely with a lower line width and mainstream exposure light to be used in the photolithography step has been a short-wavelength light such as a KrF excimer laser (wavelength: 248 nm), an ArF excimer laser (wavelength: 193 nm), a $F_2$ excimer laser (wavelength: 157 nm), or the like. A light exposure source for such short-wavelength light has a high output power and high light energy. When the support frame is irradiated with such high-energy light, the organic dye may be chemically altered to cause a change in color tone or color fading when the anodic oxide film is blackened with the organic dye as described above.

In addition, in the case of blackening through electrolytic deposition treatment, solution control including pH and solution temperature control is generally important, the electrolytic deposition treatment has high facility cost, and equipment for treating waste liquid is required. For such reasons, a method of manufacturing a support frame for a pellicle by a simpler step has been demanded. Besides, there may arise the following problem: an A7075 aluminum alloy specified by JIS is generally used for the support frame for a pellicle because an optical thin film is bonded thereonto while being extended and such state is required to be maintained with high accuracy, but when an Al—Zn—Mg based aluminum alloy such as JIS A7075 is subjected to anodic oxidation treatment and then to electrolytic deposition treatment as described in Patent Literature 2, the aluminum alloy is not sufficiently blackened.

On the other hand, in the case of anodic oxidation treatment using a sulfuric acid solution, there arises the following additional problem: an inorganic acid such as sulfuric acid or phosphoric acid remains in the anodic oxide film on the surface of the aluminum material owing to the acid solution, such inorganic acid reacts with a basic substance such as ammonia present in an exposure atmosphere to generate a reaction product such as ammonium sulfate, and the reaction product (haze) causes fogging in the pellicle and affects a transferred image of a pattern.

CITATION LIST

Patent Literature

[PTL 1] JP 2010-237282 A
[PTL 2] JP 3361429 B2

SUMMARY OF INVENTION

Technical Problem

As a result of diligent study aimed at solving the problems of the related art, the inventors of the present invention have found that a sufficiently blackened support frame for a pellicle can be obtained by annealing an Al—Zn—Mg based aluminum alloy subjected to solution treatment (or an Al—Zn—Mg based aluminum alloy subjected to solution treatment and then aging treatment), and then subjecting the aluminum alloy to anodic oxidation treatment in an alkaline solution, without treatment using an organic dye or the like or electrolytic deposition treatment. Thus, the present invention has been completed.

Thus, an object of the present invention is to provide a method of manufacturing a support frame for a pellicle, capable of forming a sufficiently blackened anodic oxide film through anodic oxidation treatment and providing a support frame for a pellicle industrially inexpensively with ease.

Another object of the present invention is to provide a support frame for a pellicle, in which there is no risk of a change in color tone and color fading even under irradiation with high-energy light and generation of haze can be suppressed as much as possible, and a pellicle including the support frame.

Solution to Problem

That is, according to one embodiment of the present invention, there is provided a method of manufacturing a support frame for a pellicle to be used as a pellicle including an optical thin film, the method including: annealing an aluminum material obtained by subjecting an Al—Zn—Mg based aluminum alloy to solution treatment or an aluminum material obtained by subjecting an Al—Zn—Mg based aluminum alloy to solution treatment and then aging treatment; and subjecting the aluminum material to anodic oxidation treatment in an alkaline solution to form an anodic oxide film having a lightness index L* value of 40 or less.

According to another embodiment of the present invention, there is provided a support frame for a pellicle, which is obtained by the method described above. According to still another embodiment of the present invention, there is provided a pellicle including the obtained support frame for a pellicle and an optical thin film.

In the present invention, an aluminum material obtained by subjecting an Al—Zn—Mg based aluminum alloy to solution treatment or an aluminum material obtained by subjecting an Al—Zn—Mg based aluminum alloy to solution treatment and then aging treatment (sometimes collectively referring to as "aluminum material") is used to provide the support frame for a pellicle. The Al—Zn—Mg based aluminum alloy is preferred for obtaining the support frame for a pellicle, for example, because the Al—Zn—Mg based aluminum alloy has the highest strength among aluminum alloys, realizes high dimensional accuracy, and can be prevented from being deformed by external force or flawed during its use. The aluminum alloy preferably contains, as chemical components of the balance other than Al, 5.1 to 6.1 mass % of Zn, 2.1 to 2.9 mass % of Mg, and 1.2 to 2.0 mass % of Cu. The aluminum alloy may further contain Fe, Si, Mn, V, Zr, and any other elements as impurities, as well as Cr, Ti, and B. As a typical example of such preferred aluminum, alloy, A7075 specified by JIS is given.

The support frame for a pellicle is generally manufactured by subjecting an ingot having a predetermined chemical composition to extrusion, rolling processing, or the like, followed by solution treatment and subsequent artificial aging hardening treatment to allow aging precipitation of a compound containing alloy elements and thereby provide strength, and then processing into an aluminum frame having a frame shape. In view of the foregoing, also in the present invention, the strength of the support frame for a pellicle can be further improved through the use of an aluminum material obtained by subjecting an Al—Zn—Mg based aluminum alloy to solution treatment and then aging treatment. As treatment for such aging precipitation, there are given, for example, treatment such as T4, T6, T7, and T651, and a T6 tempered material is preferably used. It should be noted that the aging treatment for obtaining the aluminum material conforms to the tempering conditions described in JIS H0001.

Further, in the present invention, the aluminum material obtained by subjecting an Al—Zn—Mg based aluminum alloy to solution treatment or the aluminum material obtained by subjecting an Al—Zn—Mg based aluminum alloy to solution treatment and then aging treatment is used after annealing. In this case, the annealing is desirably performed at a temperature of from 100 to 400° C., preferably from 150 to 400° C., more preferably from 150 to 350° C., still more preferably from 200 to 350° C. When the annealing temperature is less than 100° C., a sufficiently blackened support frame cannot be obtained even through subsequent anodic oxidation treatment, as described later. In contrast, when the annealing temperature exceeds 400° C., the lightness index L* value is disadvantageously increased and the anodic oxide film to be obtained tends to be whitened. In addition, the time period for the annealing is desirably from 30 to 120 minutes. With such time period, the anodic oxide film can be satisfactorily blackened and prevented from being whitened.

The cause of the influence of the annealing on blackening of the anodic oxide film is not clearly revealed, but it seems that solid solution alloy elements formed through solution treatment or aging treatment after solution treatment are re-precipitated through this thermal treatment and the resultant precipitate such as $MgZn_2$ (intermetallic compound) contributes to blackening of the support frame. Specifically, in an alkaline anodic oxidation liquid, such precipitate is trapped in the formed anodic oxide film or is partly dissolved therefrom depending on the conditions of the anodic oxidation treatment. When precipitated in a large amount, the precipitate is expected to be colored in itself (by, for example, absorption or reflection of incident light) and appear black. On the other hand, when the precipitate is precipitated in a small amount, such effect is not sufficiently exhibited and the precipitate is likely to appear in light color (metallic color). That is, when the annealing temperature is less than 100° C., precipitation of alloy elements is insufficient, and in contrast, when the annealing temperature exceeds 400° C., the precipitate becomes coarse and the number of precipitates dispersed is reduced. Thus, it seems that the above-mentioned action in the anodic oxide film is hardly exhibited. It should be noted that an excessively high annealing temperature may result in softening of the aluminum material obtained through solution treatment or further through aging treatment, and insufficient strength.

Now, $MgZn_2$, which is one of the precipitates, is focused. In the present invention, the annealing of the aluminum material is preferably performed so that the integral diffraction intensity of $MgZn_2$ measured by an X-ray diffraction method is 39 or more. The annealing is more preferably performed so that the integral diffraction intensity of $MgZn_2$ is 50 or more. When the annealing is performed so that the integral diffraction intensity of $MgZn_2$ in the aluminum material obtained through solution treatment or further through aging treatment is 39 or more as described above, a suitably blackened support frame for a pellicle can be obtained.

After the annealing, the aluminum material is subjected to anodic oxidation treatment in an alkaline solution, to form an anodic oxide film on its surface. Specifically, it is suitable to i) perform anodic oxidation treatment using an inorganic alkaline solution containing any one or more kinds of inorganic alkaline components selected from the group consisting of sodium hydroxide, potassium hydroxide, lithium hydroxide, calcium hydroxide, strontium hydroxide, and rubidium hydroxide, or ii) use a mixed alkaline solution containing salts of anyone or more kinds of organic acids selected from the group consisting of tartaric acid, citric acid, oxalic acid, and salicylic acid and any one or more kinds of inorganic alkaline components selected from the group consisting of sodium hydroxide, potassium hydroxide, lithium hydroxide, calcium hydroxide, strontium hydroxide, and rubidium hydroxide. For conventional support frames for a pellicle, anodic oxidation treatment using an acid solution such as a sulfuric acid solution has been generally heavily used, because a pattern circuit to be required is not so fine and such anodic oxidation treatment does not cause a significant problem in the case of using long-wavelength irradiation light such as i line and g line. However, as described above, in the case of using an exposure light source of a shorter wavelength having higher energy, an organic dye used for blackening may be decomposed to cause color fading or the inorganic acid trapped in the anodic oxide film may generate haze. Therefore, in the present invention, the anodic oxide film is formed by using an alkaline anodic oxidation solution such as the ones according to the above-mentioned items i) and ii).

Now, the case of using as the alkaline solution an inorganic alkaline solution containing an inorganic alkaline component according to the above-mentioned item i) is first described. In this case, an intermetallic compound other than Al is hardly dissolved during the anodic oxidation treatment because an acid component is not contained. It seems that the anodic oxide film is formed with an intermetallic compound such as $MgZn_2$ trapped therein and appears black (pseudo blackening), as described above. Of the above-mentioned inorganic alkaline components, it is preferred to use sodium hydroxide or potassium hydroxide, from the viewpoint of versatility. In addition, the aluminum material after annealing is desirably subjected to the anodic oxidation treatment by using an alkaline aqueous solution (inorganic alkaline solution) containing an inorganic alkaline component and having a pH of from 12 to 14, preferably from 12.5 to 13.5, in consideration of the generation speed of the anodic oxide film, or the like.

As the treatment conditions of the anodic oxidation treatment using the inorganic alkaline solution, the voltage is desirably 0.5 V or more and less than 20 V, preferably 1 V or more and less than 20 V, more preferably 3 V or more and 17 V or less (the simple description "from 3 to 17 V" has the same meaning; the same applies to other cases). When the anodic oxidation treatment is performed in such relatively low voltage range, a sufficiently blackened anodic oxide film can be obtained without treatment using an organic dye or the like or electrolytic deposition treatment of the related art. Specifically, when the voltage during the anodic oxidation treatment is 20 V or more, Zn serving as a constituent of $MgZn_2$ is dissolved in an alkaline electrolyte owing to the voltage set to 20 V or more while Zn is not dissolved as $MgZn_2$. Thus, an intermetallic compound such as $MgZn_2$ precipitated in the film cannot remain. In consequence, it may be difficult to achieve blackening sufficiently. In addition, it is necessary to secure an electric current to some extent during the anodic oxidation treatment for forming the anodic oxide film. For securing such electric current, the voltage during the anodic oxidation treatment is desirably set to 1 V or more.

In addition, the voltage during the anodic oxidation treatment is desirably kept almost constant from the viewpoint of making the color tone of the obtained, anodic oxide film as uniform as possible. In this case, the electrical quantity during the anodic oxidation treatment is desirably from 3 to 50 $C/cm^2$, preferably from 5 to 30 $C/cm^2$, from the viewpoint of securing the film thickness for achieving sufficient blackening.

In addition, during the anodic oxidation treatment, the solution temperature is desirably set to from 0 to 20° C., preferably from 0 to 15° C., more preferably from 5 to 10° C. When the solution temperature is less than 0° C., the generation speed of the film is reduced and the treatment becomes inefficient. In contrast, when the solution temperature exceeds 20° C., the dissolution speed of the film is increased to prolong the time period for forming the film, and dusting or the like may occur. In addition, the time period for the anodic oxidation treatment is desirably from 2 to 120 minutes, preferably from 5 to 90 minutes.

Under such anodic oxidation treatment conditions, it is desired to form an anodic oxide film having a thickness of from 1 to 15 μm preferably on the surface of the aluminum material after annealing. When the thickness of the anodic oxide film is less than 1 μm, exposure light maybe scattered owing to insufficient blackening. In contrast, when the thickness exceeds 15 μm, it may be difficult to maintain the strength of the film itself, and particles or the like may be generated.

In the case of using an inorganic alkaline solution according to the above-mentioned item i), the electrolyte is easily controlled because the anodic oxidation solution is free of an organic acid and an inorganic acid, light resistance is excellent because none of the components is decomposed by ultraviolet rays, and generation of haze or the like can be suppressed as much as possible. Specifically, the support frame for a pellicle obtained through the anodic oxidation treatment using an inorganic alkaline solution containing, for example, sodium hydroxide or potassium hydroxide according to the above-mentioned item i) has the following concentrations of ions to be eluted in 100 ml of pure water per 100 $cm^2$ of the surface area of the support flame in an ion elution test for measuring the concentrations of ions elated after immersion in pure water at 80° C. for 4 hours; 0.2 ppm or less, preferably 0.1 ppm or less, more preferably less than 0.08 ppm, still more preferably 0.05 ppm or less for an acetate ion ($CH_3COO^-$); 0.06 ppm or less, preferably 0.05 ppm or less, more preferably less than 0.03 ppm for a formate ion ($HCOO^-$); 0.01 ppm or less, preferably less than 0.005 ppm for an oxalate ion ($C_2O_4^{2-}$); 0.01 ppm or less, preferably less than 0.005 ppm for a sulfate ion ($SO_4^{2-}$); 0.02 ppm or less, preferably 0.01 ppm or less for a nitrate ion ($NO_3^-$); 0.02 ppm or less, preferably 0.01 ppm or less for a nitrite ion ($NO_2^-$); and 0.02 ppm or less, preferably 0.01 ppm or less for a chlorine ion ($Cl^-$). It should be noted that the detection of the ions to be eluted can be performed by ion chromatography analysis. The detailed measurement conditions are as described in Examples.

Those ions affect the generation of haze. Of those ions, the elution amounts of an acetate ion, a formate ion, a sulfate ion, an oxalate ion, and a nitrite ion can be controlled to provide a support frame for a pellicle having a haze as low as possible. In contrast, in the case of subjecting the anodic oxide film after forming to electrolytic deposition treatment to blacken the film, alternating current electrolysis is often performed by using a solution containing nickel sulfate, nickel acetate, or the like. Therefore, its acid component is trapped in the anodic oxide film. As a result, when an obtained support frame for a pellicle is subjected to such ion elution test, a sulfate ion, an acetate ion, and the like are detected in large amounts.

On the other hand, in the case of using a mixed alkaline solution containing a salt of an organic acid and an inorganic alkaline component according to the above-mentioned item ii), there is a blackening action of an intermetallic compound such as $MgZn_2$ as in the case of using an inorganic alkaline solution according to the above-mentioned item i). In addition, there may be a coloring action of an organic acid component to be trapped in the anodic oxide film. It should be noted that the target organic acid is limited to those listed above because of the need to take into consideration light resistance, generation of haze, or the like.

Of those, as a salt of tartaric acid, a tartrate such as sodium tartrate, potassium tartrate, sodium potassium tartrate, and ammonium tartrate can be preferably used. The concentration of such salt of tartaric acid is desirably from 13 to 200 g/L, preferably from 25 to 150 g/L. When the concentration of such salt of tartaric acid is less than 13 g/L, the anodic oxide film is hardly formed. In contrast, when the concentration exceeds 200 g/L, the color tone of the anodic oxide film to be obtained is not that different to that in the case where the concentration is 200 g/L, and the salt of tartaric acid may be disadvantageously precipitated during the anodic oxidation at low temperature. In addition, an alkaline aqueous solution (mixed alkaline solution) containing the salt of tartaric acid and an inorganic alkaline component desirably has a pH of from 12 to 14, preferably from 12.5 to 13.0. When the pH is less than 12, the generation speed of the film is reduced and it may be difficult to blacken the support frame.

Similarly, as a salt of citric acid, a citrate such as sodium citrate, potassium citrate, lithium citrate, and ammonium citrate can be preferably used. The concentration of such salt of citric acid is desirably from 20 to 300 g/L, preferably from 50 to 200 g/L. An alkaline aqueous solution (mixed alkaline solution) containing the salt of citric acid and an inorganic alkaline component desirably has a pH of from 12 to 14, preferably from 12.5 to 13.0. In addition, as a salt of oxalic acid, an oxalate such as sodium oxalate, potassium oxalate, and ammonium oxalate can be preferably used. The concentration of such salt of oxalic acid is desirably from 3 to 350 g/L, preferably from 10 to 300 g/L. An alkaline aqueous solution (mixed alkaline solution) containing the salt of oxalic acid and an inorganic alkaline component desirably has a pH of from 12 to 14, preferably from 12.5 to 13.5. Further, as a salt of salicylic acid, a salicylate such as sodium salicylate, potassium salicylate, lithium salicylate, and ammonium salicylate can be preferably used. The concentration of such salt of salicylic acid is desirably from 1 to 500 g/L, preferably from 30 to 400 g/L. An alkaline aqueous solution (mixed alkaline solution containing the salt of salicylic acid and an inorganic alkaline component desirably has a pH of from 12 to 14, preferably from 12.5 to 13.5.

In addition, as the treatment conditions of the anodic oxidation treatment using the mixed alkaline solution containing a salt of an organic acid and an inorganic alkaline component, the voltage during the anodic oxidation treatment is desirably set to a relatively low voltage of 2 V or more and less than 20 V from the viewpoint of obtaining a sufficiently blackened film without treatment using an organic dye or the like or electrolytic deposition treatment of the related art, as in the case of using an inorganic alkaline solution according to the above-mentioned item i). The details are described below.

Specifically, in the case of a mixed alkaline solution containing the salt of tartaric acid and an inorganic alkaline component, the voltage is desirably from 2 to 19 V, preferably from 5 to 17 V, more preferably from 7 to 15 V. In addition, in the case of a mixed alkaline solution containing the salt of citric acid and an inorganic alkaline component, the voltage is from 2 to 19 V, preferably from 3 to 17 V, more preferably from 5 to 15 V. In the case of a mixed alkaline solution containing the salt of oxalic acid and an inorganic alkaline component, the voltage is from 2 to 19 V, preferably from 3 to 17 V, more preferably from 5 to 15 V. Further, in the case of a mixed alkaline solution containing the salt of salicylic acid and an inorganic alkaline component, the voltage is from 3 to 19 V, preferably from 5 to 17 V, more preferably from 7 to 15 V.

In addition, the electrical quantity during the anodic oxidation treatment desirably ranges from 3 to 50 $C/cm^2$, preferably from 5 to 30 $C/cm^2$ in the case of using an inorganic alkaline solution according to the above-mentioned item i). In addition, in the case of the mixed alkaline solution containing the salt of tartaric acid and an inorganic alkaline component, the electrical quantity desirably ranges from 3 to 50 $C/cm^2$, preferably from 5 to 30 $C/cm^2$. In the case of the mixed alkaline solution containing the salt of citric acid and an inorganic alkaline component, the electrical quantity desirably ranges from 3 to 50 $C/cm^2$, preferably from 5 to 30 $C/cm^2$. In the case of the mixed alkaline solution containing the salt of oxalic acid and an inorganic alkaline component, the electrical quantity desirably ranges from 3 to 50 $C/cm^2$, preferably from 5 to 30 $C/cm^2$. In the case of the mixed alkaline solution containing the salt of salicylic acid and an inorganic alkaline component, the electrical quantity desirably ranges from 5 to 70 $C/cm^2$, preferably from 7 to 50 $C/cm^2$.

In addition, the solution temperature is desirably set to from 0 to 20° C., preferably from 0 to 15° C., more preferably from 5 to 10° C., by as in the case of using an inorganic alkaline solution according to the above-mentioned item i). Further, the time period for the anodic oxidation treatment is desirably from 5 to 40 minutes, preferably from 7 to 20 minutes.

Under such anodic oxidation treatment conditions, it is desired to form an anodic oxide film having a thickness of from 1 to 15 μm on the surface of the aluminum material after annealing. When the thickness of the anodic oxide film is less than the lower limit of the above-mentioned range, exposure light maybe scattered owing to insufficient blackening. In contrast, when the thickness exceeds the upper limit of the above-mentioned range, the amount of an acid component to be trapped in the film may be excessively increased. It should be noted that, in the case of using a mixed alkaline solution containing a salt of an organic acid and an inorganic alkaline component such as sodium hydroxide according to the above-mentioned item ii), a predetermined anodic oxide film can be obtained while the use amount of an acid liable to cause haze is reduced, as compared to the case of forming an anodic oxide film by using an inorganic acid such as sulfuric acid (generally in an amount of from about 100 to 200 g/L), which is generally used in the related art. In the case of blackening the film through electrolytic deposition treatment, cathode electrolysis is performed to precipitate a metal such as Ni. Therefore, the anodic oxide film is broken and cannot be colored unless the film itself has strength to some extent. In contrast, in the present invention, the film is in no danger of being broken because the cathode electrolysis is not required, and the anodic oxide film can be produced at a lower voltage.

Also in the case of using a mixed alkaline solution containing a salt of an organic acid and an inorganic alkaline component according to the above-mentioned item ii), a support frame for a pellicle having a haze as low as possible can be obtained, as in the case of using an inorganic alkaline solution according to the above-mentioned item i). Specifically, the obtained support frame for a pellicle has the following concentrations of ions to be elated in 100 ml of pure water per 100 $cm^2$ of the surface area of the support flame in an ion elution test for measuring the concentrations of ions eluted after immersion in pure water at 80° C. for 4 hours: 0.2 ppm or less, preferably 0.1 ppm or less, more preferably less than 0.08 ppm, still more preferably 0.05 ppm or less for an acetate ion; 0.06 ppm or less, preferably 0.05 ppm or less, more preferably less than 0.03 ppm for a formate ion; 0.01 ppm or less, preferably less than 0.005 ppm for an oxalate ion; 0.01 ppm or less, preferably less than 0.005 ppm for a sulfate ion; 0.02 ppm or less, preferably 0.01 ppm or less for a nitrate ion; 0.02 ppm or less, preferably 0.01 ppm or less for a nitrite ion; and 0.02 ppm or less, preferably 0.01 ppm or less for a chlorine ion.

A sufficiently blackened anodic oxide film having a lightness index L* value based on the Hunter's color difference formula, or JIS Z8722-2009 of 40 or less, preferably an L value of 35 or less can be obtained without secondary electrolysis or coloring treatment using an organic dye, by i) performing the anodic oxidation treatment using the inorganic alkaline solution or by ii) performing the anodic oxidation treatment using the mixed alkaline solution containing a salt of an organic acid and an inorganic alkaline component, as the synergy with the effect of annealing the aluminum material obtained from the Al—Zn—Mg based aluminum alloy.

In addition, sealing treatment may be performed after the anodic oxidation treatment. The conditions of the sealing treatment are not particularly limited. While any known method such as one using steam or a sealing solution may be adopted, sealing treatment using steam is desired from the viewpoint of sealing an acid component without incorporation of impurities. The conditions of the sealing treatment using steam are desirably as follows: for example, a temperature of from 105 to 130° C.; a relative humidity of from 90 to 100% (R.H.); a pressure of from 0.4 to 2.0 kg/cm$^2$G; and a treatment time period of from 12 to 60 minutes. It should be noted that, after the sealing treatment, washing with pure water or the like is desirably performed.

In addition, in the present invention, the surface of the aluminum material may be subjected to roughening treatment by mechanical means such as blast processing or chemical means using an etching solution, prior to the anodic oxidation treatment. A low reflective black support frame like matted one can be obtained by preliminarily performing such roughening treatment and then the anodic oxidation treatment.

The support frame for a pellicle obtained by the present invention can be used as a pellicle after an optical thin film is bonded on one surface thereof. The optical thin film is not particularly limited, and any known optical film may be used. Examples thereof may include: inorganic substances such as quarts; and polymers such as nitrocellulose, polyethylene terephthalate, a cellulose ester, polycarbonate, and polymethyl methacrylate. In addition, the optical thin film may include an antireflection film containing an inorganic substance such as $CaF_2$ or a polymer such as polystyrene and Teflon (trademark).

In addition, a pressure-sensitive adhesive body for fixing the pellicle onto a photomask or a reticle is provided on the end surface of the support frame opposite to the surface on which the optical thin film is provided. As the pressure-sensitive adhesive body, a pressure-sensitive adhesive material alone or a material obtained by applying the pressure-sensitive adhesive material onto both the surfaces of an elastic base may be used. Herein, examples of the pressure-sensitive adhesive material may include adhesive agents such as an acryl-based one, a rubber-based one, a vinyl-based one, an epoxy-based one, and a silicone-based one. In addition, as a highly elastic material to serve as the base, a rubber and foam are given. Examples thereof may include, but not particularly limited to, a butyl rubber, polyurethane foam, and polyethylene foam.

Advantageous Effects of Invention

According to one embodiment of the present invention, the sufficiently blackened support frame for a pellicle can be obtained through the anodic oxidation treatment. In addition, the obtained support frame for a pellicle exhibits excellent light resistance even under irradiation with high-energy light, and generation of haze can be suppressed as much as possible because the amount of an acid component is small and an organic dye and the like are not contained. In addition, the support frame for a pellicle obtained by the present invention has high dimensional accuracy, is less liable to be flawed, has excellent durability, and is less liable to emit dust. Therefore, when used as a pellicle, such pellicle is suitable for photolithography through exposure with high-energy light such as a KrF excimer laser, an ArF excimer laser, a $F_2$ excimer laser, or the like, and can be reliably used over a long period of time.

DESCRIPTION OF EMBODIMENTS

Preferred embodiments of the present invention are hereinafter described on the basis of Examples and Comparative Examples.

Example 1

Anodic Oxidation Treatment Using NaOH Solution

[Confirmation Test for Blackening Through Annealing]

For confirming a blackening effect through annealing, aluminum materials each obtained by subjecting an Al—Zn—Mg based aluminum alloy to solution treatment and then aging treatment, that is, JIS A7075 aluminum alloy materials each treated to serve as a material of temper designation T6 specified in JIS H0001 (JIS A7075-T6), were each subjected to heat treatment at the temperature and for the time period shown in Table 1. Then, the aluminum alloy materials after the heat treatment were each subjected so the anodic oxidation treatment described below. Thus, surface-treated aluminum alloy materials for experiment were obtained and measured for the L* value.

Specifically, in this experiment, the JIS A7075-T6 materials were each subjected to heat treatment in the atmosphere under the conditions shown in Table 1. Then, the samples were each polished with emery paper #600 for achieving the same surface state. Next, the samples were each subjected to anodic oxidation treatment by using as an electrolyte an alkaline aqueous solution (pH=14) in which 100 g/L of sodium hydroxide (NaOH) was dissolved under the conditions of a solution temperature of 15° C., an electrolysis voltage of 15 V, and an electrical quantity of 40° C./cm$^2$. After that, sealing treatment was performed for 30 minutes while steam having a relative humidity of 100% (R.H.), a pressure of 2.0 kg/cm$^2$G, and a temperature of 130° C. was generated. For each of the obtained aluminum alloy materials, the resultant anodic oxide film was measured for the lightness index L* value based on the Hunter's color difference formula. The results are shown in Table 1.

TABLE 1

| Evaluation item: L* | | Time period for heat treatment [min] | | | |
|---|---|---|---|---|---|
| value | | 0 | 30 | 60 | 120 |
| Temperature of heat treatment after T6 [° C.] | None | 42.1 | — | — | — |
| | 50 | — | 42.1 | 41.9 | 41.8 |
| | 100 | — | 42.0 | 41.7 | 41.5 |
| | 150 | — | 41.4 | 41.0 | 40.8 |
| | 200 | — | 38.2 | 36.2 | 35.8 |
| | 250 | — | 34.2 | 29.1 | 27.2 |
| | 300 | — | 28.3 | 26.8 | 27.7 |
| | 350 | — | 27.1 | 25.8 | 26.9 |
| | 400 | — | 29.8 | 31.9 | 36.2 |
| | 450 | — | 35.7 | 37.5 | 40.8 |

The results shown above confirmed that the L* value was reduced (highly blackened) in the cases of heat treatment at from 100° C. to 400° C. as compared to the not-treated case. It was revealed that, of those cases, the L* value was satisfactorily reduced in the cases of heat treatment at from 250° C. to 350° C. as compared to the non-treated case. The samples were revealed to be remarkably blackened particularly in the cases of 250° C.×60 minutes to 120 minutes, 300° C.×30 minuses to 120 minutes, 350° C.×30 minutes to 120 minutes, and 400° C.×30 minutes.

In addition, for examining the precipitation state of $MgZn_2$ through annealing in the surface-treated aluminum alloy material for experiment, the JIS A7075-T6 material after the heat treatment and before the anodic oxidation treatment and the JIS A7075-T6 material after the heat treatment and further the anodic oxidation treatment were each determined for the integral diffraction intensity at the $MgZn_2$ peak (diffraction angle $2\theta=19.7°$) by an X-ray diffraction method. The relationships between the obtained integral diffraction intensities and the L* value of the corresponding surface-treated aluminum alloy material for experiment obtained through anodic oxidation treatment of the A7075-T6 material are summarized in Table 2. In Table 2, the integral diffraction intensity of $MgZn_2$ in the case of a JIS A7075-T6 material without heat treatment is also shown. Comparison with such case confirmed that the heat treatment at a predetermined temperature increased the precipitation of $MgZn_2$.

It should be noted that the X-ray diffraction was performed by a Bragg-Brentano optics, focusing method using an X-ray diffractometer RAD-rR manufactured by Rigaku Corporation. There were employed a goniometer having a radius of 185 mm, a measurement mode of $2\theta/\theta$, a Cu—K$\alpha$ tube of a wavelength of 1.54056 Å, and a monochromator. The conditions were as follows: a tube voltage of 50 kV; a tube current of 200 mA; a scanning area of $2\theta=10°$ to 70°; a shaft moving speed of 1.0°/min; a width of a data sample of 0.010°; inner rotation of a sample of 80 times/min; and a divergence slit of 1°, a scattering slit of 1°, a light receiving slit of 0.3 mm, and a monochrome light receiving slit of 0.3 mm, as slits. A scintillation detector was used for the measurement.

TABLE 2

| Heat treatment | Integral diffraction intensity of $MgZn_2$ before surface treatment [unit: kcounts] | Integral diffraction intensity of $MgZn_2$ after surface treatment [unit: kcounts] | L* value of surface-treated aluminum alloy material for experiment |
| --- | --- | --- | --- |
| None | 7.8 | 4.1 | 42.1 |
| 100° C. × 120 min | 22.8 | 10.1 | 41.5 |
| 200° C. × 120 min | 86.9 | 44.2 | 35.8 |
| 300° C. × 120 min | 113.6 | 75.0 | 27.7 |
| 400° C. × 120 min | 72.9 | 42.6 | 36.2 |

[Confirmation Test for Blackening Through Anodic Oxidation Treatment]

For confirming a blackening effect through anodic oxidation treatment, the following test was performed. Hollow extrusion materials each formed of a JIS A7075 aluminum alloy treated to serve as a material of temper designation T6 specified in JIS H0001 (JIS A7075-T6) were each cut and processed into a frame shape having support frame external dimensions of 160 mm×130 mm×5 mm in height and a support frame thickness of 3 mm through grinding and polishing. Thus, aluminum frames were prepared. The aluminum frames were annealed at a heat treatment temperature of 250° C. for a time period of heat treatment of 120 minutes. In the atmosphere, and then the surfaces of the aluminum frames after annealing were subjected to shot blasting treatment using stainless steel having an average diameter of about 100 μm.

Next, the aluminum frames after shot blasting treatment were each subjected to anodic oxidation treatment by using as an electrolyte an alkaline aqueous solution (pH=14) in which 50 g/L of sodium hydroxide (NaOH) was dissolved at a solution temperature of 15° C. under the conditions of the electrolysis voltage and the electrical quantity shown in Table 3. After washing with water, the anodic oxide films formed on the surfaces of the aluminum frames were each measured with an eddy current type film thickness meter (manufactured by Fischer Instruments K. K.).

Next, the aluminum frames after anodic oxidation treatment were each washed with pure water and then subjected to sealing treatment for 30 minutes while steam having a relative humidity of 100% (R.H.), a pressure of 2.0 kg/cm$^2$G, and a temperature of 130° C. was generated in a steam sealing apparatus. Thus, support frames for a pellicle according to Test Examples 1-1 to 1-16 were obtained. For the obtained support frames for a pellicle, the results of blackness and a lightness index L* value based on the Hunter's color difference formula are shown in Table 3. It should be noted that the blackness is evaluated as Symbol "o" in the case of an L* value of 40 or less and as Symbol "x" in the case of an L* value exceeding 40 in Table 3.

In addition, a support frame for a pellicle according to Test Example 1-17 was obtained in the same manner as that of Test Example 1-3 except that the A7075-T6 material was not annealed. For the obtained support frame for a pellicle, the results of blackness and an L* value are shown in Table 3.

TABLE 3

| | Voltage (V) | Electrical quantity (C/cm$^2$) | Thickness* (μm) | Electrolytic solution/ solution temperature | L* value | Blackness | Remark |
| --- | --- | --- | --- | --- | --- | --- | --- |
| Test example 1-1 | 0.5 | 5 | 1.5 | NaOH/15° C. | 38.2 | ○ | Corresponding to Example |
| Test example 1-2 | 1 | 3 | 1 | | 36.9 | ○ | Corresponding to Example |
| Test example 1-3 | 3 | 7 | 2 | | 31.4 | ○ | Corresponding to Example |
| Test example 1-4 | 5 | 10 | 2.5 | | 31.0 | ○ | Corresponding to Example |
| Test example 1-5 | 7 | 20 | 5 | | 29.5 | ○ | Corresponding to Example |

TABLE 3-continued

| | Voltage (V) | Electrical quantity (C/cm$^2$) | Thickness* (μm) | Electrolytic solution/ solution temperature | L* value | Blackness | Remark |
|---|---|---|---|---|---|---|---|
| Test example 1-6 | 10 | 5 | 1.5 | | 28.9 | ○ | Corresponding to Example |
| Test example 1-7 | 13 | 50 | 15 | | 28.0 | ○ | Corresponding to Example |
| Test example 1-8 | 15 | 10 | 2.5 | | 27.2 | ○ | Corresponding to Example |
| Test example 1-9 | 17 | 20 | 5 | | 28.7 | ○ | Corresponding to Example |
| Test example 1-10 | 19 | 20 | 5 | | 37.8 | ○ | Corresponding to Example |
| Test example 1-11 | 19 | 50 | 15 | | 39.8 | ○ | Corresponding to Example |
| Test example 1-12 | 20 | 20 | 16 | | 41.2 | X | Corresponding to Comparative Example |
| Test example 1-13 | 20 | 10 | 3 | | 40.1 | X | Corresponding to Comparative Example |
| Test example 1-14 | 25 | 20 | 14 | | 47.2 | X | Corresponding to Comparative Example |
| Test example 1-15 | 30 | 20 | 16 | | 45.7 | X | Corresponding to Comparative Example |
| Test example 1-16 | 50 | 50 | 15 | | 47.0 | X | Corresponding to Comparative Example |
| Test example 1-17 | 15 | 7 | 3 | | 42.1 | X | Corresponding to Comparative Example (not annealed) |

*The thickness is the thickness of an anodic oxide film.

The results shown above reveal that the sufficiently blackened support frame for a pellicle can be obtained through annealing and anodic oxidation treatment using a sodium hydroxide solution at a voltage value of 0.5 V or more and less than 20 V.

[Confirmation Test of Ion Elution Amount]

The support frame for a pellicle obtained in Test Example 1-1 was put into a polyethylene bag and the bag was sealed after 100 ml of pure water were added thereto. Then, the support frame was immersed therein for 4 hours while the temperature was kept at 80° C. Extraction water thus obtained in which components eluted from the support frame were extracted was analyzed with an ion chromatographic analysis device (ICS-2000 manufactured by Dionex Corporation) under the conditions of a cell temperature of 35° C., a column (Ion Pac AS11-HC) temperature of 40° C., and 1.5 ml/min. An acetate ion, a formate ion, a chlorine ion, a nitrite ion, a nitrate ion, a sulfate ion, and an oxalate ion were detected from the extraction water, and the concentrations of those ions to be elated in 100 ml of pure water per 100 cm$^2$ of the surface area of the support frame were determined. The results are shown in Table 4. It should be noted that the quantitative limit (lower limit) of the ion chromatographic analysis device used in this test varies from 0.01 to 0.001 ppm depending on the kind of the ion and the analysis results shown in Table 4 indicate that a nitrite ion, a nitrate ion, a sulfate ion, and an oxalate ion were not detected.

TABLE 4

| | Ion elution amount (ppm) | | | | | | |
|---|---|---|---|---|---|---|---|
| | CH$_3$COO$^-$ | HCOO$^-$ | Cl$^-$ | NO$_2^-$ | NO$_3^-$ | SO$_4^{2-}$ | C$_2$O$_4^{2-}$ |
| Test example 1-1 | <0.01 | <0.001 | <0.002 | <0.002 | <0.005 | <0.005 | <0.005 |

Example 2

Anodic Oxidation Treatment Using Mixed Solution Containing Sodium Tartrate+NaOH

[Confirmation Test for Blackening Through Annealing]

Surface-treated aluminum alloy materials for experiment were obtained in the same manner as in the [Confirmation test for blackening through annealing] section in Example 1 except that the anodic oxidation treatment was performed by using as an electrolyte an alkaline aqueous solution (pH=13.1) in which 50 g/L of sodium tartrate dihydrate ($Na_2C_4H_4O_6 \cdot 2H_2O$) and 5 g/L of sodium hydroxide were dissolved under the conditions of a solution temperature of 10° C., an electrolysis voltage of 15 V, and an electrical quantity of 20 $C/cm^2$. The obtained aluminum alloy materials were each measured for the L* value. The results are shown in Table 5.

TABLE 5

| Evaluation item: L* | | Time period for heat treatment [min] | | |
|---|---|---|---|---|
| value | | 0 | 30 | 60 | 120 |
| Temperature | None | 43.12 | — | — | — |
| of heat | 100 | — | 43.11 | 42.87 | 42.18 |
| treatment | 150 | — | 40.91 | 40.02 | 39.43 |
| after | 200 | — | 39.65 | 38.58 | 36.29 |
| T6 [° C.] | 250 | — | 36.01 | 35.25 | 34.26 |
| | 300 | — | 34.36 | 34.91 | 35.28 |
| | 350 | — | 36.89 | 38.37 | 38.94 |
| | 400 | — | 41.26 | 41.77 | 43.90 |

The results shown above confirmed that the L* value was reduced (highly blackened) in the cases of heat treatment at from 100 to 350° C. as compared to the non-treated case. It was revealed that, of those cases, the L* value was satisfactorily reduced in the cases of heat treatment at from 150 to 350° C. as compared to the non-treated case. The samples were revealed to be remarkably blackened particularly in the cases of 250° C.×120 minutes, 300° C.×30 minutes, and 300° C.×60 minutes.

In addition, for examining the precipitation state of $MgZn_2$ through annealing in the surface-treated aluminum alloy material for experiment, the integral diffraction intensity at the $MgZn_2$ peak (diffraction angle 2θ=19.7°) was determined by an X-ray diffraction method in the same manner as in the [Confirmation test for blackening through annealing] section in Example 1. The results are as shown in Table 6.

TABLE 6

| Heat treatment | Integral diffraction intensity of $MgZn_2$ before surface treatment [unit: kcounts] | Integral diffraction intensity of $MgZn_2$ after surface treatment [unit: kcounts] | L* value of surface-treated aluminum alloy material for experiment |
|---|---|---|---|
| None | 8.9 | 8.8 | 43.12 |
| 150° C. × 120 min | 39.4 | 22.5 | 39.43 |
| 200° C. × 120 min | 46.5 | 42.8 | 36.29 |
| 250° C. × 120 min | 95.7 | 70.1 | 34.26 |
| 300° C. × 120 min | 104.7 | 68.7 | 35.28 |
| 350° C. × 120 min | 97.2 | 51.9 | 38.94 |
| 400° C. × 120 min | 46.3 | 43.8 | 43.90 |

[Confirmation Test for Blackening Through Anodic Oxidation Treatment]

Support frames for a pellicle according to Test Examples 2-1 to 2-13 were obtained in the same manner as in the [Confirmation test for blackening through anodic oxidation treatment] section in Example 1 except that the anodic oxidation treatment was performed by using as an electrolyte an alkaline aqueous solution (pH=13.1) in which 50 g/L of sodium tartrate dihydrate ($Na_2C_4H_4O_6 \cdot 2H_2O$) and 5 g/L of sodium hydroxide were dissolved at a solution temperature of 10° C. under the conditions of the electrolysis voltage and the electrical quantity shown in Table 7. The effect of the anodic oxidation treatment using a mixed alkaline solution containing sodium tartrate and sodium hydroxide was confirmed. The results are shown in Table 7. It should be noted that Test Example 2-13 followed the procedure of Test Example 2-2 except that the A7075-T6 material was not annealed.

In addition, as a reference for comparison, a support frame for a pellicle according to Test Example 2-14 was obtained by subjecting an aluminum frame only subjected to shot blasting treatment without annealing to anodic oxidation treatment by using an electrolytic solution containing a 15 mass % (150 g/L) sulfuric acid aqueous solution at 20° C. at a voltage of 18 V, followed by sealing treatment. As another reference for comparison, a support frame for a pellicle according to Test Example 2-15 was obtained by subjecting an aluminum frame only subjected to shot blasting treatment without annealing to anodic oxidation treatment by using an electrolytic solution containing a 5 mass % (50 g/L) oxalic acid aqueous solution at 30° C. at a voltage of 35 V, followed by sealing treatment. For those support frames for a pellicle, the evaluation results of an L* value and blackness are shown in Table 7.

TABLE 7

| | Voltage (V) | Electrical quantity ($C/cm^2$) | Thickness* (μm) | Electrolytic solution/ solution temperature | L* value | Blackness | Remark |
|---|---|---|---|---|---|---|---|
| Test example 2-1 | 2 | 15 | 4 | Na tartrate/10° C. | 39.13 | ○ | Corresponding to Example |
| Test example 2-2 | 10 | 7 | 3 | | 34.26 | ○ | Corresponding to Example |
| Test example 2-3 | 15 | 15 | 4 | | 34.52 | ○ | Corresponding to Example |

TABLE 7-continued

| | Voltage (V) | Electrical quantity (C/cm$^2$) | Thickness* (μm) | Electrolytic solution/ solution temperature | L* value | Blackness | Remark |
|---|---|---|---|---|---|---|---|
| Test example 2-4 | 15 | 25 | 6.5 | | 33.31 | ○ | Corresponding to Example |
| Test example 2-5 | 17 | 15 | 4.5 | | 39.82 | ○ | Corresponding to Example |
| Test example 2-6 | 17 | 25 | 6.5 | | 38.95 | ○ | Corresponding to Example |
| Test example 2-7 | 19 | 25 | 6 | | 39.76 | ○ | Corresponding to Example |
| Test example 2-8 | 1 | — | 0 | | — | X | Corresponding to Comparative Example |
| Test example 2-9 | 30 | 15 | 4.5 | | 47.62 | X | Corresponding to Comparative Example |
| Test example 2-10 | 30 | 25 | 6 | | 47.58 | X | Corresponding to Comparative Example |
| Test example 2-11 | 35 | 15 | 4 | | 50.14 | X | Corresponding to Comparative Example |
| Test example 2-12 | 39 | 25 | 6 | | 51.24 | X | Corresponding to Comparative Example |
| Test example 2-13 | 10 | 7 | 2.5 | | 53.75 | X | Corresponding to Comparative Example (not annealed) |
| Test example 2-14 | 18 | 7 | 2.5 | Sulfuric acid/20° C. | 63.92 | X | Corresponding to Comparative Example |
| Test example 2-15 | 35 | 7 | 3 | Oxalic acid/30° C. | 61.78 | X | Corresponding to Comparative Example |

*The thickness is the thickness of an anodic oxide film.

The results shown above reveal that the sufficiently blackened support frame for a pellicle can be obtained through annealing and anodic oxidation treatment using a mixed alkaline solution containing sodium tartrate and sodium hydroxide at a voltage value of 2 V or more and less than 20 V.

[Confirmation Test of Ion Elution Amount]

The support frames for a pellicle obtained in Test Examples 2-2, 2-14, and 2-15 were each put into a polyethylene bag and the bag was sealed after 100 ml of pure water were added thereto. Then, the support frames were each immersed therein for 4 hours while the temperature was kept at 80° C. The concentrations of the ions were measured in the same manner as in the [Confirmation test of ion elution amount] section in Example 1. The results are as shown in Table 8, and it is revealed that acid components causing base are less trapped in the case of using the mixed alkaline solution containing sodium tartrate and sodium hydroxide as compared to the cases of using the electrolytic solutions of a sulfuric acid aqueous solution and an oxalic acid aqueous solution.

TABLE 8

| | Ion elution amount (ppm) | | | | | | |
|---|---|---|---|---|---|---|---|
| | $CH_3COO^-$ | $HCOO^-$ | $Cl^-$ | $NO_2^-$ | $NO_3^-$ | $SO_4^{2-}$ | $C_2O_4^{2-}$ |
| Test example 2-2 | 0.05 | 0.028 | 0.007 | 0.008 | <0.005 | <0.005 | <0.005 |
| Test example 2-14 | 1.25 | 0.15 | 0.009 | 0.053 | 0.071 | 0.26 | <0.005 |
| Test example 2-15 | 0.11 | 0.078 | 0.010 | 0.007 | <0.005 | <0.005 | 0.010 |

Example 3

Anodic Oxidation Treatment Using Mixed Solution Containing Sodium Citrate+NaOH

[Confirmation Test for Blackening Through Annealing]
Surface-treated aluminum alloy materials for experiment were obtained in the same manner as in the [Confirmation test for blackening through annealing] section in Example 1 except that the anodic oxidation treatment was performed by using as an electrolyte an alkaline aqueous solution (pH=12.7) in which 100 g/L of sodium citrate dihydrate ($Na_3(C_6H_5O_7) \cdot 2H_2O$) and 5 g/L of sodium hydroxide were dissolved under the conditions of a solution temperature of 10° C., an electrolysis voltage of 19 V, and an electrical quantity of 7 C/cm². The obtained aluminum alloy materials were each measured for the L* value. The results are shown in Table 9.

TABLE 9

| Evaluation item: L* | | Time period for heat treatment [min] | | | |
|---|---|---|---|---|---|
| value | | 0 | 30 | 60 | 120 |
| Temperature of heat treatment after T6 [° C.] | None | 52.2 | — | — | — |
| | 100 | — | 39.8 | 39.7 | 39.4 |
| | 150 | — | 39.6 | 39.2 | 38.8 |
| | 200 | — | 38.7 | 37.1 | 35.2 |
| | 250 | — | 36.9 | 32.8 | 31.5 |
| | 300 | — | 29.1 | 27.8 | 31.8 |
| | 350 | — | 31.1 | 31.4 | 32.3 |
| | 400 | — | 32.8 | 33.0 | 34.7 |
| | 450 | — | 36.8 | 39.1 | 40.7 |

The results shown above confirmed that the L* value was reduced (highly blackened) in the cases of heat treatment at from 100° C. to 400° C. as compared to the non-treated case. It was revealed that, of those cases, the L* value was satisfactorily reduced in the cases of heat treatment at from 200° C. to 400° C. as compared to the non-treated case. The samples were revealed to be remarkably blackened particularly in the cases of 250° C.×60 minutes, 250° C.×120 minutes, 300° C.×30 minutes, and 300° C.×60 minutes.

In addition, for examining the precipitation state of $MgZn_2$ through annealing in the surface-treated aluminum alloy material for experiment, the integral diffraction intensity at the $MgZn_2$ peak (diffraction angle 2θ=19.7°) was determined by an X-ray diffraction method in the same manner as in the [Confirmation test for blackening through annealing] section in Example 1. The results are as shown in Table 10.

TABLE 10

| Heat treatment | Integral diffraction intensity of $MgZn_2$ before surface treatment [unit: kcounts] | Integral diffraction intensity of $MgZn_2$ after surface treatment [unit: kcounts] | L* value of surface-treated aluminum alloy material for experiment |
|---|---|---|---|
| None | 8.7 | 4.3 | 52.2 |
| 200° C. × 120 min | 48.4 | 23.2 | 35.2 |
| 250° C. × 120 min | 94.5 | 60.2 | 31.5 |
| 300° C. × 120 min | 107.2 | 69.4 | 31.8 |
| 350° C. × 120 min | 99.0 | 64.7 | 32.3 |
| 400° C. × 120 min | 45.8 | 19.5 | 34.7 |

[Confirmation Test for Blackening Through Anodic Oxidation Treatment]

Support frames for a pellicle according to Test Examples 3-1 to 3-17 were obtained in the same manner as in the [Confirmation test for blackening through anodic oxidation treatment] section in Example 1 except that the anodic oxidation treatment was performed by using as an electrolyte an alkaline aqueous solution (pH=12.7) in which 100 g/L of sodium citrate dihydrate ($Na_3(C_6H_5O_7) \cdot 2H_2O$) and 5 g/L of sodium hydroxide were dissolved at a solution temperature of 10° C. under the conditions of the electrolysis voltage and the electrical quantity shown in Table 11. The effect of the anodic oxidation treatment using a mixed alkaline solution containing sodium citrate and sodium hydroxide was confirmed. The results are shown in Table 11. It should be noted that Test Example 3-17 followed the procedure of Test Example 3-5 except that the A7075-T6 material was not annealed.

TABLE 11

| | Voltage (V) | Electrical quantity (C/cm²) | Thickness* (μm) | Electrolytic solution/ solution temperature | L* value | Blackness | Remark |
|---|---|---|---|---|---|---|---|
| Test example 3-1 | 2 | 15 | 4 | Na citrate/10° C. | 30.59 | ○ | Corresponding to Example |
| Test example 3-2 | 2 | 25 | 6.5 | | 31.54 | ○ | Corresponding to Example |
| Test example 3-3 | 15 | 15 | 3.5 | | 29.98 | ○ | Corresponding to Example |
| Test example 3-4 | 15 | 25 | 6.5 | | 29.77 | ○ | Corresponding to Example |
| Test example 3-5 | 17 | 7 | 3 | | 31.77 | ○ | Corresponding to Example |
| Test example 3-6 | 17 | 15 | 3.5 | | 31.96 | ○ | Corresponding to Example |
| Test example 3-7 | 18 | 25 | 6 | | 34.58 | ○ | Corresponding to Example |
| Test example 3-8 | 18 | 15 | 3.5 | | 33.70 | ○ | Corresponding to Example |

TABLE 11-continued

| | Voltage (V) | Electrical quantity (C/cm$^2$) | Thickness* (µm) | Electrolytic solution/ solution temperature | L* value | Blackness | Remark |
|---|---|---|---|---|---|---|---|
| Test example 3-9 | 19 | 25 | 6 | | 38.99 | ○ | Corresponding to Example |
| Test example 3-10 | 1 | — | 0 | | — | X | Corresponding to Comparative Example |
| Test example 3-11 | 45 | 15 | 4 | | 41.53 | X | Corresponding to Comparative Example |
| Test example 3-12 | 45 | 25 | 6.5 | | 42.47 | X | Corresponding to Comparative Example |
| Test example 3-13 | 50 | 15 | 3.5 | | 43.44 | X | Corresponding to Comparative Example |
| Test example 3-14 | 50 | 25 | 6.5 | | 50.23 | X | Corresponding to Comparative Example |
| Test example 3-15 | 55 | 15 | 3.5 | | 51.03 | X | Corresponding to Comparative Example |
| Test example 3-16 | 55 | 25 | 6.5 | | 50.36 | X | Corresponding to Comparative Example |
| Test example 3-17 | 20 | 7 | 3 | | 52.21 | X | Corresponding to Comparative Example (not annealed) |

*The thickness is the thickness of an anodic oxide film.

The results shown above reveal that the sufficiently blackened support frame for a pellicle can be obtained through annealing and anodic oxidation treatment using a mixed alkaline solution containing sodium citrate and sodium hydroxide at a voltage value of 2 V or more and 19 V or less.

[Confirmation Test of Ion Elution Amount]

The support frame for a pellicle obtained in Test Example 3-5 was put into a polyethylene bag and the bag was sealed after 100 ml of pure water were added thereto. Then, the support frame was immersed therein for 4 hours while the temperature was kept at 80° C. The concentrations of the ions were measured in the same manner as in the [Confirmation test of ion elution amount] section in Example 1. The results are as shown in Table 12, and it is revealed that acid components causing base are less trapped through the use of the mixed alkaline solution containing sodium citrate and sodium hydroxide.

TABLE 12

| | Ion elution amount (ppm) | | | | | | |
|---|---|---|---|---|---|---|---|
| | CH$_3$COO$^-$ | HCOO$^-$ | Cl$^-$ | NO$_2^-$ | NO$_3^-$ | SO$_4^{2-}$ | C$_2$O$_4^{2-}$ |
| Test example 3-5 | 0.04 | 0.022 | 0.007 | 0.007 | <0.005 | <0.005 | <0.005 |

Example 4

Anodic Oxidation Treatment Using Mixed Solution Containing Sodium Oxalate+NaOH

[Confirmation Test for Blackening Through Annealing]

Surface-treated aluminum alloy materials for experiment were obtained in the same manner as in the [Confirmation test for blackening through annealing] section in Example 1 except that the anodic oxidation treatment was performed by using as an electrolyte an alkaline aqueous solution (pH=12.9) in which 25 g/L of sodium oxalate (Na$_2$C$_2$O$_4$) and 5 g/L of sodium hydroxide were dissolved under the conditions of a solution temperature of 10° C., an electrolysis voltage of 15 V, and an electrical quantity of 20 C/cm$^2$. The obtained aluminum alloy materials were each measured for the L* value. The results are shown in Table 13.

TABLE 13

| Evaluation item: L* value | | Time period for heat treatment [min] | | | |
|---|---|---|---|---|---|
| | | 0 | 30 | 60 | 120 |
| Temperature of heat treatment after T6 [° C.] | None | 41.7 | — | — | — |
| | 100 | — | 40.9 | 40.8 | 40.5 |
| | 150 | — | 39.8 | 39.2 | 36.7 |
| | 200 | — | 32.9 | 33.2 | 30.2 |
| | 250 | — | 28.8 | 27.9 | 28.0 |
| | 300 | — | 33.8 | 34.1 | 35.1 |
| | 350 | — | 36.4 | 36.7 | 37.4 |
| | 400 | — | 36.2 | 36.4 | 36.7 |
| | 450 | — | 37.9 | 38.7 | 40.2 |

The results shown above confirmed that the L* value was reduced (highly blackened) in the cases of heat treatment at from 150 to 400° C. as compared to the non-treated case. It was revealed that, of those cases, the L* value was satisfactorily reduced in the cases of heat treatment at from 200 to 250° C. as compared to the non-treated case. The samples were revealed to be remarkably blackened particularly in the cases of 250° C.×30 to 120 minutes.

In addition, for examining the precipitation state of MgZn$_2$ through annealing in the surface-treated aluminum alloy material for experiment, the integral diffraction intensity at the MgZn$_2$ peak (diffraction angle 2θ=19.7°) was determined by an X-ray diffraction method in the same manner as in the [Confirmation test for blackening through annealing] section in Example 1. The results are as shown in Table 14.

TABLE 14

| Heat treatment | Integral diffraction intensity of MgZn$_2$ before surface treatment [unit: kcounts] | Integral diffraction intensity of MgZn$_2$ after surface treatment [unit: kcounts] | L* value of surface-treated aluminum alloy material for experiment |
|---|---|---|---|
| None | 8.9 | 7.3 | 41.7 |
| 150° C. × 120 min | 39.4 | 25.6 | 36.7 |
| 200° C. × 120 min | 46.5 | 35.3 | 30.2 |
| 250° C. × 120 min | 95.7 | 73.2 | 28.0 |
| 300° C. × 120 min | 104.7 | 82.9 | 35.1 |
| 350° C. × 120 min | 97.2 | 74.0 | 37.4 |
| 400° C. × 120 min | 46.3 | 34.7 | 36.7 |
| 450° C. × 120 min | 41.2 | 27.3 | 40.2 |

[Confirmation Test for Blackening Through Anodic Oxidation Treatment]

Support frames for a pellicle according to Test Examples 4-1 to 4-17 were obtained in the same manner as in the [Confirmation test for blackening through anodic oxidation treatment] section in Example 1 except that the anodic oxidation treatment was performed by using as an electrolyte an alkaline aqueous solution (pH=12.9) in which 25 g/L of sodium oxalate ($Na_2C_2O_4$) and 5 g/L of sodium hydroxide were dissolved at a solution temperature of 10° C. under the conditions of the electrolysis voltage and the electrical quantity shown in Table 15. The effect of the anodic oxidation treatment using a mixed alkaline solution containing sodium oxalate and sodium hydroxide was confirmed. The results are shown in Table 15. It should be noted that Test Example 4-17 followed the procedure of Test Example 4-7 except that the A7075-T6 material was not annealed.

TABLE 15

| | Voltage (V) | Electrical quantity (C/cm$^2$) | Thickness* (μm) | Electrolytic solution/ solution temperature | L* value | Blackness | Remark |
|---|---|---|---|---|---|---|---|
| Test example 4-1 | 2 | 15 | 4.5 | Na oxalate/10° C. | 28.33 | ○ | Corresponding to Example |
| Test example 4-2 | 2 | 25 | 6.5 | | 34.54 | ○ | Corresponding to Example |
| Test example 4-3 | 3 | 15 | 5 | | 30.61 | ○ | Corresponding to Example |
| Test example 4-4 | 3 | 25 | 6.5 | | 33.68 | ○ | Corresponding to Example |
| Test example 4-5 | 7 | 15 | 5 | | 31.07 | ○ | Corresponding to Example |
| Test example 4-6 | 7 | 25 | 6.5 | | 33.53 | ○ | Corresponding to Example |
| Test example 4-7 | 10 | 7 | 2.5 | | 31.09 | ○ | Corresponding to Example |
| Test example 4-8 | 15 | 15 | 4.5 | | 36.98 | ○ | Corresponding to Example |
| Test example 4-9 | 15 | 25 | 6.5 | | 34.70 | ○ | Corresponding to Example |
| Test example 4-10 | 17 | 15 | 5 | | 37.39 | ○ | Corresponding to Example |
| Test example 4-11 | 17 | 25 | 6 | | 37.68 | ○ | Corresponding to Example |
| Test example 4-12 | 19 | 15 | 4.5 | | 39.87 | ○ | Corresponding to Example |
| Test example 4-13 | 19 | 25 | 6.5 | | 38.21 | ○ | Corresponding to Example |
| Test example 4-14 | 1 | — | 0 | | — | X | Corresponding to Comparative Example |
| Test example 4-15 | 30 | 15 | 4.5 | | 43.95 | X | Corresponding to Comparative Example |

TABLE 15-continued

| | Voltage (V) | Electrical quantity (C/cm²) | Thickness* (μm) | Electrolytic solution/ solution temperature | L* value | Blackness | Remark |
|---|---|---|---|---|---|---|---|
| Test example 4-16 | 30 | 25 | 5.4 | | 42.60 | X | Corresponding to Comparative Example |
| Test example 4-17 | 10 | 7 | 2.5 | | 43.21 | X | Corresponding to Comparative Example (not annealed) |

*The thickness is the thickness of an anodic oxide film.

The results shown above reveal that the sufficiently blackened support frame for a pellicle can be obtained through annealing and anodic oxidation treatment using a mixed alkaline solution containing sodium oxalate and sodium-hydroxide at a voltage value of 2 V or more and 19 V or less.

[Confirmation Test of Ion Elation Amount]

The support frame for a pellicle obtained in Test Example 4-7 was put into a polyethylene bag and the bag was sealed after 100 ml of pure water were added thereto. Then, the support frame was immersed therein for 4 hours while the temperature was kept at 80° C. The concentrations of the ions were measured in the same manner as in the [Confirmation test of ion elution amount] section in Example 1. The results are as shown in Table 16, and it is revealed that acid components causing haze are less trapped in the case of using the mixed alkaline solution containing sodium oxalate and sodium hydroxide.

TABLE 16

| | Ion elution amount (ppm) | | | | | | |
|---|---|---|---|---|---|---|---|
| | $CH_3COO^-$ | $HCOO^-$ | $Cl^-$ | $NO_2^-$ | $NO_3^-$ | $SO_4^{2-}$ | $C_2O_4^{2-}$ |
| Test example 4-7 | 0.04 | 0.025 | 0.006 | 0.009 | <0.005 | <0.005 | <0.005 |

Example 5

Anodic Oxidation Treatment Using Mixed Solution Containing Sodium Salicylate+NaOH

[Confirmation Test for Blackening Through Annealing]

Surface-treated aluminum alloy materials for experiment were obtained in the same manner as in the [Confirmation test for blackening through annealing] section in Example 1 except that the anodic oxidation treatment was performed by using as an electrolyte an alkaline aqueous solution (pH=13.7) in which 100 g/L of sodium salicylate ($NaC_7H_5O_3$) and 20 g/L of sodium hydroxide were dissolved under the conditions of a solution temperature of 15° C., an electrolysis voltage of 19 V, and an electrical quantity of 40 C/cm². The obtained aluminum alloy materials were each measured for the L* value. The results are shown in Table 17.

The results shown below confirmed that the L* value was reduced (highly blackened) in the cases of hear treatment at from 100° C. to 400° C. as compared to the non-treated case. It was revealed that, of those cases, the L* value was satisfactorily reduced in the cases of heat treatment at from 200° C. to 350° C. as compared to the non-treated case. The samples were revealed to be remarkably blackened particularly in the cases of 250° C.×120 minutes, 300° C.×30 minutes to 120 minutes, 350° C.×30 minutes to 120 minutes, and 400° C.×30 minutes.

TABLE 17

| Evaluation item: L* value | | Time period for heat treatment [min] | | |
|---|---|---|---|---|
| | | 0 | 30 | 60 | 120 |
| Temperature of heat treatment after T6 [° C.] | None | 43.7 | — | — | — |
| | 50 | — | 43.5 | 43.6 | 43.1 |
| | 100 | — | 42.3 | 42.5 | 42.8 |
| | 150 | — | 41.6 | 41.2 | 40.2 |
| | 200 | — | 37.0 | 35.9 | 35.1 |
| | 250 | — | 33.4 | 31.0 | 27.5 |
| | 300 | — | 28.6 | 27.9 | 28.1 |
| | 350 | — | 27.4 | 26.7 | 27.6 |
| | 400 | — | 29.3 | 32.8 | 35.6 |
| | 450 | — | 37.4 | 39.2 | 41.3 |

In addition, for examining the precipitation state of $MgZn_2$ through annealing in the surface-treated aluminum alloy material for experiment, the integral diffraction intensity at the $MgZn_2$ peak (diffraction angle 2θ=19.7°) was determined by an X-ray diffraction method in the same manner as in the [Confirmation test for blackening through annealing] section in Example 1. The results are as shown in Table 18.

TABLE 18

| Heat treatment | Integral diffraction intensity of $MgZn_2$ before surface treatment [unit: kcounts] | Integral diffraction intensity of $MgZn_2$ after surface treatment [unit: kcounts] | L* value of surface-treated aluminum alloy material for experiment |
|---|---|---|---|
| None | 8.4 | 3.8 | 43.7 |
| 100° C. × 120 min | 23.6 | 11.2 | 42.8 |
| 200° C. × 120 min | 75.1 | 47.8 | 35.1 |
| 300° C. × 120 min | 101.8 | 65.7 | 28.1 |
| 400° C. × 120 min | 64.9 | 44.0 | 35.6 |

[Confirmation Test for Blackening Through Anodic Oxidation Treatment]

Support frames for a pellicle according to Test Examples 5-1 to 5-17 were obtained in the same manner as in the [Confirmation test for blackening through anodic oxidation treatment] section in Example 1 except that the anodic oxidation treatment was performed by using as an electrolyte an alkaline aqueous solution (pH=13.7) in which 100 g/L of sodium salicylate ($NaC_7H_5O_3$) and 20 g/L of sodium hydroxide were dissolved at a solution temperature of 15° C. under the conditions of the electrolysis voltage and the electrical quantity shown in Table 19. The effect of the anodic oxidation treatment using a mixed alkaline solution containing sodium salicylate and sodium hydroxide was confirmed. The results are shown in Table 19. It should be noted that Test Example 5-17 followed the procedure of Test Example 5-3 except that the A7075-T6 material was not annealed.

TABLE 19

| | Voltage (V) | Electrical quantity ($C/cm^2$) | Thickness* (μm) | Electrolytic solution/ solution temperature | L* value | Blackness | Remark |
|---|---|---|---|---|---|---|---|
| Test example 5-1 | 3 | 10 | 2 | Na salicylate/15° C. | 38.7 | ○ | Corresponding to Example |
| Test example 5-2 | 3 | 20 | 5 | | 36.2 | ○ | Corresponding to Example |
| Test example 5-3 | 15 | 7 | 2.5 | | 34.2 | ○ | Corresponding to Example |
| Test example 5-4 | 15 | 10 | 3 | | 30.9 | ○ | Corresponding to Example |
| Test example 5-5 | 15 | 20 | 5 | | 27.6 | ○ | Corresponding to Example |
| Test example 5-6 | 17 | 5 | 1.5 | | 38.1 | ○ | Corresponding to Example |
| Test example 5-7 | 17 | 50 | 15 | | 32.4 | ○ | Corresponding to Example |
| Test example 5-8 | 18 | 10 | 3 | | 37.9 | ○ | Corresponding to Example |
| Test example 5-9 | 18 | 20 | 5 | | 36.6 | ○ | Corresponding to Example |
| Test example 5-10 | 19 | 10 | 3 | | 38.8 | ○ | Corresponding to Example |
| Test example 5-11 | 19 | 20 | 5 | | 36.1 | ○ | Corresponding to Example |
| Test example 5-12 | 45 | 20 | 5 | | 41.0 | X | Corresponding to Comparative Example |
| Test example 5-13 | 2 | 10 | 3 | | 43.9 | X | Corresponding to Comparative Example |
| Test example 5-14 | 2 | 20 | 5 | | 46.0 | X | Corresponding to Comparative Example |
| Test example 5-15 | 50 | 20 | 5 | | 42.9 | X | Corresponding to Comparative Example |
| Test example 5-16 | 50 | 50 | 15 | | 45.1 | X | Corresponding to Comparative Example |
| Test example 5-17 | 15 | 7 | 2.5 | | 42.1 | X | Corresponding to Comparative Example (not annealed) |

*The thickness is the thickness of an anodic oxide film.

The results shown above reveal that the sufficiently blackened support frame for a pellicle can be obtained through annealing and anodic oxidation treatment using a mixed alkaline solution containing sodium salicylate and sodium hydroxide at a voltage value of 3 V or more and 19 V or less.

[Confirmation Test of Ion Elution Amount]

The support frame for a pellicle obtained in Test Example 5-3 was each put into a polyethylene bag and the bag was sealed after 100 ml of pure water were added thereto. Then, the support frame was immersed therein for 4 hours while the temperature was kept at 80° C. The concentrations of the ions were measured in the same manner as in the [Confirmation test of ion elution amount] section in Example 1. The results are as shown in Table 20, and it is revealed that acid components causing base are less trapped in the case of using the mixed alkaline solution containing sodium salicylate and sodium hydroxide.

TABLE 20

| | Ion elution amount (ppm) | | | | | | |
|---|---|---|---|---|---|---|---|
| | $CH_3COO^-$ | $HCOO^-$ | $Cl^-$ | $NO_2^-$ | $NO_3^-$ | $SO_4^{2-}$ | $C_2O_4^{2-}$ |
| Test example 5-3 | 0.02 | 0.019 | 0.015 | 0.009 | <0.005 | <0.005 | <0.005 |

INDUSTRIAL APPLICABILITY

The support frame for a pellicle and the pellicle obtained by the present invention can be used in a photolithography step or the like in manufacturing of various semiconductor devices. liquid crystal display devices, and the like, and exhibit the effects more effectively particularly upon exposure with high-energy light.

The invention claimed is:

1. A method of manufacturing a support frame for a pellicle to be used as a pellicle comprising an optical thin film,
the method comprising:
annealing an aluminum material obtained by subjecting an Al—Zn—Mg based aluminum alloy to solution treatment or an aluminum material obtained by subjecting an Al—Zn—Mg based aluminum alloy to solution treatment and then aging treatment, so that an integral diffraction intensity of $MgZn_2$ measured by an X-ray diffraction method is 39.0 or more; and
subjecting the aluminum material to anodic oxidation treatment in an alkaline solution to form an anodic oxide film having a lightness index L* value of 40 or less.

2. A method of manufacturing a support frame for a pellicle according to claim 1, wherein the alkaline solution comprises an inorganic alkaline solution containing any one or more kinds of inorganic alkaline components selected from the group consisting of sodium hydroxide, potassium hydroxide, lithium hydroxide, calcium hydroxide, strontium hydroxide, and rubidium hydroxide.

3. A method of manufacturing a support frame for a pellicle according to claim 1, wherein the alkaline solution comprises a mixed alkaline solution containing salts of any one or more kinds of organic acids selected from the group consisting of tartaric acid, citric acid, oxalic acid, and salicylic acid and any one or more kinds of inorganic alkaline components selected from the group consisting of sodium hydroxide, potassium hydroxide, lithium hydroxide, calcium hydroxide, strontium hydroxide, and rubidium hydroxide.

4. A method of manufacturing a support frame for a pellicle according to claim 2, wherein the anodic oxidation treatment is performed by using the inorganic alkaline solution at a voltage of 0.5 V or more and less than 20 V.

5. A method of manufacturing a support frame for a pellicle according to claim 3, wherein the anodic oxidation treatment is performed by using the mixed alkaline solution at a voltage of 2 V or more and less than 20 V.

6. A method of manufacturing a support frame for a pellicle according to claim 1, further comprising, prior to the anodic oxidation treatment, subjecting a surface of the aluminum material to roughening treatment.

7. A method of manufacturing a support frame for a pellicle according to claim 1, wherein the Al—Zn—Mg based aluminum alloy comprises an A7075 aluminum alloy specified by JIS.

8. A method of manufacturing a support frame for a pellicle according to claim 1, further comprising, after the anodic oxidation treatment, performing sealing treatment using a sealing solution or steam.

9. A support frame for a pellicle, which is obtained by the method according to claim 1 and has concentrations of ions to be eluted in 100 ml of pure water per 100 $cm^2$ of a surface area of the support flame in an ion elution test for measuring concentrations of ions eluted after immersion in pure water at 80° C. for 4 hours of: 0.2 ppm or less for an acetate ion; 0.06 ppm or less for a formate ion; 0.01 ppm or less for an oxalate ion; 0.01 ppm or less for a sulfate ion; 0.02 ppm or less for a nitrate ion; 0.02 ppm or less for a nitrite ion; and 0.02 ppm or less for a chlorine ion.

10. A pellicle, comprising:
the support frame for a pellicle according to claim 9; and
an optical thin film.

11. A method of manufacturing a support frame for a pellicle according to claim 1, wherein the annealing is conducted at temperature of 100° C. to 400° C. for 30 minutes to 120 minutes.

* * * * *